(12) United States Patent
Wang et al.

(10) Patent No.: US 12,308,289 B2
(45) Date of Patent: *May 20, 2025

(54) METHOD FOR MANUFACTURING AN ELECTRONIC DEVICE

(71) Applicant: InnoLux Corporation, Miao-Li County (TW)

(72) Inventors: Cheng-Chi Wang, Miao-Li County (TW); Yeong-E Chen, Miao-Li County (TW); Cheng-En Cheng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 708 days.

This patent is subject to a terminal disclaimer.

(21) Appl. No.: 17/503,398

(22) Filed: Oct. 18, 2021

(65) Prior Publication Data

US 2022/0130715 A1 Apr. 28, 2022

(30) Foreign Application Priority Data

Oct. 22, 2020 (CN) .......................... 202011141658.6
Sep. 30, 2021 (CN) .......................... 202111157230.5

(51) Int. Cl.
| | |
|---|---|
| *H01L 21/768* | (2006.01) |
| *H01L 21/027* | (2006.01) |
| *H01L 21/288* | (2006.01) |
| *H01L 21/48* | (2006.01) |
| *H01L 21/66* | (2006.01) |
| *H01L 21/683* | (2006.01) |

(52) U.S. Cl.
CPC ........ *H01L 21/7684* (2013.01); *H01L 21/027* (2013.01); *H01L 21/2885* (2013.01); *H01L 21/4857* (2013.01); *H01L 21/6838* (2013.01); *H01L 22/12* (2013.01)

(58) Field of Classification Search
CPC ......... H01L 21/6734; H01L 21/68–682; H01L 21/683; H01L 21/6838
See application file for complete search history.

(56) References Cited

U.S. PATENT DOCUMENTS 11,551,970 B2 * 1/2023 Wang ................. H01L 21/6838
2012/0208349 A1 8/2012 O'Halloran

FOREIGN PATENT DOCUMENTS

| CN | 101379590 A | 3/2009 |
| CN | 104203779 A | 12/2014 |

* cited by examiner

*Primary Examiner* — Evan G Clinton
(74) *Attorney, Agent, or Firm* — Winston Hsu (57) ABSTRACT

The present disclosure discloses a method for manufacturing an electronic device, including: setting a basic working area; providing a supporting platform having a plurality of vacuum valves; disposing a substrate on the supporting platform; applying vacuum attraction to a portion of the substrate through a portion of the plurality of vacuum valves, wherein the portion of the substrate corresponding to the vacuum attraction is defined as an attracted region; and performing an exposure on a portion of the attracted region, wherein an area of the attracted region is larger than the basic working area and smaller than an area of the supporting platform.

19 Claims, 11 Drawing Sheets

METHOD FOR MANUFACTURING AN ELECTRONIC DEVICE

BACKGROUND OF THE DISCLOSURE

1. Field of the Disclosure

The present disclosure relates to a method for manufacturing an electronic device, and in particular to a method for manufacturing an electronic device in which the manufacturing process is performed in subsections on a substrate.

2. Description of the Prior Art

In today's technology, the manufacture and production processes for some electronic devices are usually performed upon an entire substrate. Therefore, the related technologies are naturally developed based on the entire substrate.

However, accompanied by an increase in the size of the substrate, the size of the target object to be controlled in the manufacturing process also increases, which makes the manufacturing technology more challenging, such as increasing the manufacturing costs due to, for example, the equipment costs.

SUMMARY OF THE DISCLOSURE

One of the objectives of the present disclosure is to provide a method for manufacturing an electronic device to solve the problems encountered by the existing method for manufacturing the electronic devices.

An embodiment of the present disclosure provides a method for manufacturing an electronic device, comprising: setting a basic working area; providing a supporting platform having a plurality of vacuum valves; disposing a substrate on the supporting platform; applying vacuum attraction to a portion of the substrate through a portion of the plurality of vacuum valves, wherein the portion of the substrate corresponding to the vacuum attraction is defined as an attracted region; and performing an exposure on a portion of the attracted region, wherein an area of the attracted region is larger than the basic working area and smaller than an area of the supporting platform.

According to the method for manufacturing the electronic device of the present disclosure, through setting the basic working area as the basis to perform the manufacturing process in subsection on the substrate, the difficulty of producing the electronic devices can be reduced and the manufacturing cost can be lowered, and the effect of improving product quality is further achieved.

These and other objectives of the present disclosure will no doubt become obvious to those of ordinary skill in the art after reading the following detailed description of the embodiment that is illustrated in the various figures and drawings.

DETAILED DESCRIPTION

The present disclosure will be described in detail below in combination with examples and drawings. It should be noted that, in order to facilitate a better understanding for the readers and simplify the drawings, several drawings in this disclosure only depict a portion of the device or structure, and the specific elements in the drawings are not drawn according to actual scale. Moreover, the number and the size of each element in the drawings are merely for illustration and not intended to limit the scope of the present disclosure.

Throughout this disclosure, certain terms are used to refer to the specific elements in the description and claims. Those skilled in the art should understand that the electronic device manufacturers may refer to the same elements by different terms. The present disclosure is not intended to distinguish those elements with the same functions but different terms. In the following description and claims, the words such as "comprise" and "include" are to be construed in an open-ended, inclusive sense meaning "including, but not limited to." The terms "comprising", "including" and/or "having" in this specification specify the existence of the described features, regions, steps, operations and/or elements, but are not intended to exclude the existence or addition of one or more other features, regions, steps, operations, elements, and/or combinations thereof.

When an element or a layer is referred to as being "on" or "connected to" the another element or layer, it may be directly on the another element or layer or directly connected to the another element or layer, or an intervening element or layer may existed between the two. In contrast, when an element is referred to as being "directly on" or "directly connected to" the other element or layer, there is no intervening element or layer existed in between.

In the present disclosure, the terms "about", "around", "approximately", and "substantially" usually indicate that there may be a slight error between two objects, for example, a characteristic value is within a range of 20% of a given value, or within the range of 10%, 5%, 3%, 2%, 1% or 0.5% of the given value. A given quantity here is an approximate quantity, that is, even in an absence of a specific description of "about", "around", "approximately" or "substantially", it may still imply the meaning of "about", "around", "approximately" or "substantially".

It should be noted that, without departing from the spirit of the present disclosure, various features of different embodiments can be replaced, rearranged, or combined to accomplish other embodiments.

According to the method for manufacturing the electronic device disclosed in the present disclosure, a substrate is considered to be composed of multiple subsets assembled together, and the manufacturing process of the electronic device is not necessarily performed based on an entire substrate, but based on the subset. In the present disclosure, a size or an area of the subset is referred to as a "basic working area". The basic working area is determined by the bottleneck process in a sequence of the manufacturing processes. In more detail, in the present disclosure, a maximum area that can be processed in an optimized manufacturing process is called a "Maximum Optimized Process Area (MOPA)". When manufacturing an electronic device, the MOPA of each manufacturing process in a sequence of the related manufacturing processes may not be the same. Therefore, in the present disclosure, the smallest MOPA among all manufacturing processes is selected as the basic working area. Taking panel-level package (PLP) product manufacturing processes as an example, based on its design and the stacked structure, the related processes and their corresponding MOPA are shown in Table 1 below. It should be noted that the present disclosure is not limited to the panel-level package manufacturing processes.

TABLE 1

| Processes Items | Maximum Optimized Process Area (MOPA) |
| --- | --- |
| Photoresist coating, development, etching | an entire substrate |
| Exposure | 6 inches |
| Metal plating | an entire substrate |
| Polishing | 12 inches |

Among the processes and their own MOPAs as shown in Table 1, the MOPA of the photoresist coating, development, and etching processes may be the entire substrate. The MOPA of the exposure process may be an exposable range (that is, an exposure region) for one shot of an exposure tool, such as 6 inches. The MOPA of the metal plating process may be the entire substrate. The MOPA of the polishing process may be determined by the capability of the polishing equipment, such as 12 inches. It can be told that, in the example of panel-level package product manufacturing processes, the MOPA of the exposure process is the smallest MOPA and the exposure process is the bottleneck process. Therefore, based on the definition of the subset aforementioned, in the panel-level package product manufacturing processes mentioned above, the basic working area is determined by the MOPA of the exposure process. It can be told from the above example that a method for determining a subset and/or a basic working area includes: Deciding all manufacturing processes performed on a substrate, determining the MOPA of each manufacturing process, and selecting the smallest MOPA as the basic working area for all the manufacturing processes of the product. Furthermore, the subset refers to the smallest manufacturing process unit when repeating the same process on the substrate. Therefore, according to the method for manufacturing the electronic device of the present disclosure, after the basic working area is determined, multiple subsets can be further defined on the substrate, for example (but not limited to), these subsets can be arranged repeatedly along the horizontal and vertical directions to form an array of subsets. In one manufacturing process, the same process may be performed sequentially on each subset until all the subsets are applied the same process.

In the present disclosure, the method for manufacturing the electronic device may be based on the aforementioned method for selecting MOPA and the definition of the subset, and the manufacturing process is performed on the basis of the subset. Among them, the area of the subset (the basic working area) equals to the smallest MOPA among all manufacturing processes. That is, according to the method for manufacturing the electronic device of the present disclosure, setting the basic working area, and then adjusting the implementation of at least a portion of the manufacturing processes m on the basis of the basic working area, whereby the manufacturing process may be carried out in subsection on the substrate.

Figure 1:
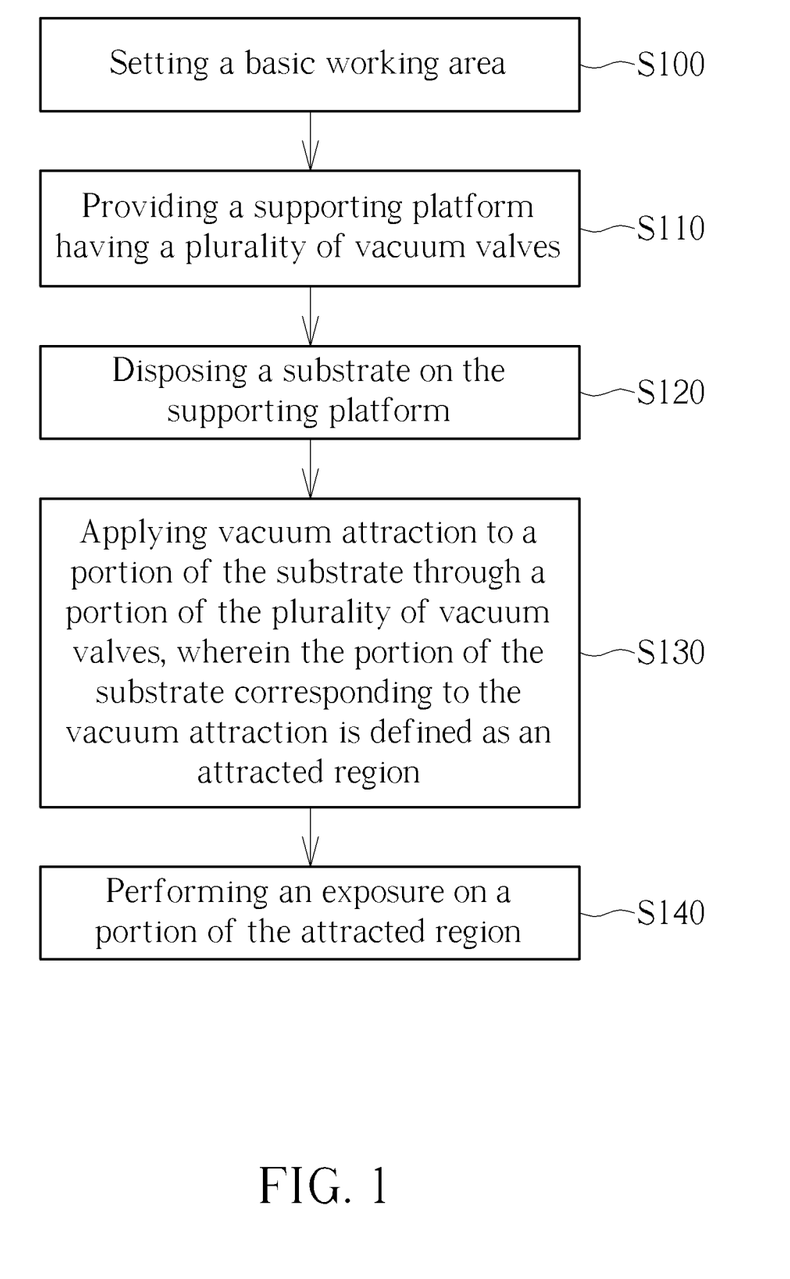
FIG. 1 is a schematic flowchart of a method for manufacturing an electronic device according to an embodiment of the present disclosure.
Figure 2A:
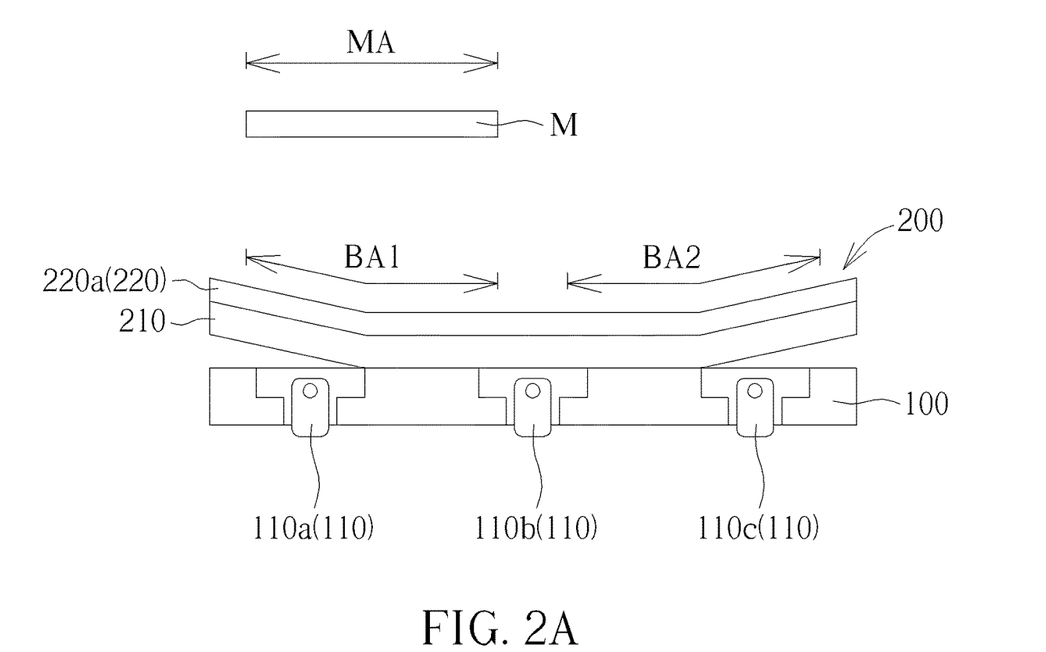
FIG. 2A to 2E are schematic views of the manufacturing processes of the method for manufacturing the electronic device of the present disclosure.

Referring to FIG. 1 and FIG. 2A to 2E, FIG. 1 is a schematic flowchart of the method for manufacturing the electronic device according to an embodiment of the present disclosure. FIG. 2A to FIG. 2E are schematic views of the manufacturing process of the method for manufacturing the electronic device of the present disclosure. As shown in FIG. 1 and FIG. 2A to FIG. 2E, the method for manufacturing the electronic device according to an embodiment of the present disclosure may include steps S100 to S140, but it is not limited thereto. In some embodiments, steps may be added or deleted as required. Among them, the manufactured electronic device can comprise a panel, a liquid crystal antenna or a package component, but it is not limited thereto. First, step S100 is performed to set a basic working area, wherein the basic working area is the area of a subset as defined above. The definition, size, and way of selection are detailed above and will not be repeated here. After step S100, perform step S110. As shown in FIG. 2A, a supporting platform 100 is provided, wherein the supporting platform 100 contains a plurality of vacuum valves 110. The supporting platform 100 may be, for example (but not limited to), a platform belonging to an exposure system for supporting substrate in an exposure process. Next, perform step S120 to dispose a substrate 200 on the supporting platform 100, wherein the substrate 200 may contain a base 210 and at least one layer 220, but it is not limited thereto. The base 210 may contain hard substrate materials or flexible substrate materials, such as glass, sapphire, ceramics, polymeric materials such as polyimide (PI), polyethylene naphthalate (PEN), polyethylene terephthalate (PET), other plastic materials or combinations thereof, or other suitable base materials. The layer 220 may be, for example, a metal layer, a dielectric layer, an insulating layer, a photoresist layer, or other suitable layers. Since the present embodiment merely shows the case of exposure process as an example, for simplicity, FIG. 2A only depicts the base 210 and the photoresist layer 220a in the substrate 200. In general, the substrate 200 is prone to warpage in the manufacturing process due to the material issues. FIG. 2A also illustrates that the substrate 200 disposed on the supporting platform 100 is warped, for example, on the left and right sides of the substrate 200. It should be noted that, the exposure process is used as the basis for determining the basic working area in the present embodiment, and therefore a mask M used in the exposure process is illustrated, and an area MA of the mask M shown in FIG. 2A is taken as an exposure area of one shot in the exposure process, and is defined as the basic working area. In some embodiments, a plurality of subsets may be defined on the substrate 200. For example, FIG. 2A illustrates a subset BA1 and a subset BA2, but it is not limited thereto. Those skilled in the art should understand that the basic working area defined by the area of the mask of the exposure process in FIG. 2A is merely an example. The actual basic working area may be generally different from the area MA of the mask. For example, the basic working area may be defined by the exposed area on the substrate in one exposure step (shot) of the exposure process.

Figure 2B:
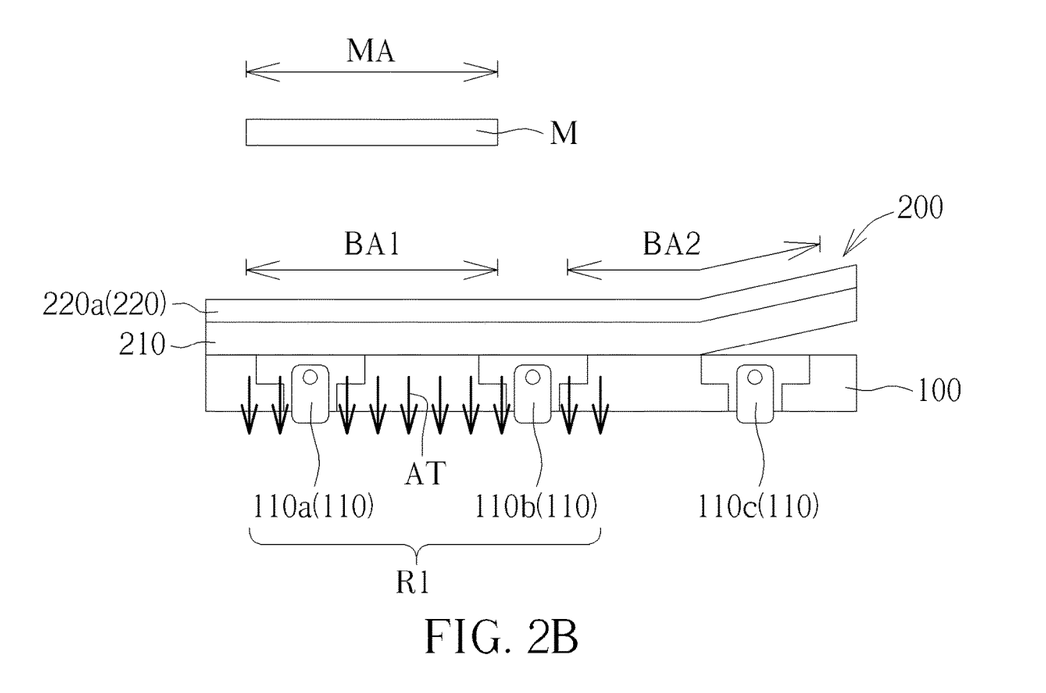

After step S120, perform step S130. As shown in FIG. 2B, a vacuum attraction step AT is performed on a portion of the substrate 200 simultaneously through a portion of the plurality of vacuum valves 110, wherein the portion of the substrate 200 corresponding to the vacuum attraction is defined as an attracted region R1. The portion of the aforementioned vacuum valves 110 are depicted as vacuum valve 110a and vacuum valve 110b in FIG. 2B as an example, and the other portion of the vacuum valves 110 (such as vacuum valve 110c) may not apply vacuum attraction to the substrate 200. Due to a warpage of the substrate 200 may occur, vacuum attraction has to be applied to the entire substrate before the subsequent manufacturing processes to flatten the substrate 200 and reduce manufacturing process errors. However, according to the present disclosure, when performing a manufacturing process with a smaller or the smallest MOPA, it is not necessary to consider the warpage of the entire substrate 200 and apply vacuum attraction to the entire substrate 200 simultaneously. It is only necessary to consider the warpage within the range corresponding to the subset (basic working area) and apply vacuum attraction to the portion of the substrate 200. As shown in FIG. 2B, before performing the exposure step on the subset BA1, it is only necessary to apply vacuum attraction step AT to the portion of the substrate 200 (that is, the portion of the substrate 200 containing the subset BA1, which is also the attracted region R1) through a portion of the plurality of vacuum valves 110 on the supporting platform 100, thereby flattening the attracted region R1, wherein the attracted region R1 may be greater than or equal to the subset BA1. FIG. 2B is an example of the attracted region R1 being greater than the subset BA1. Since the substrate 200 is integrally connected, in the present embodiment, the area corresponding to the vacuum attraction (attracted region R1) of the substrate 200 may be larger than the basic working area so as to ensure that the warpage within the subset can be flattened by vacuum attraction.

Taken together the aforementioned descriptions, in the method for manufacturing the electronic device of the present disclosure, the area of the attracted region R1 may be larger than the basic working area and smaller than the area of the supporting platform 100. For example, the attracted region R1 may be a rectangular and has straight borders on four sides, each straight border has two ends. At each end, a straight border may has a length 10% to 20% greater than the length of border on the correspond side of the basic working area (i.e., the total length of the attracted region may be 20% to 40% greater than the length of border on the correspond side of the basic working area). For example, in some embodiments, the length of the area of the attracted region R1 may be 1.2 times the length of the basic working area (that is, 1+0.1×2 times), and the width of the area of the attracted region R1 can be 1.2 times the width of the basic working area (that is, 1+0.1×2 times), therefore the area of the attracted region R1 can be 1.44 times the basic working area (1.2 times the length of the basic working area multiplied by 1.2 times the width of the basic working area).

While in other embodiments, the length of the area of the attracted region R1 may be 1.4 times the length of the basic working area (that is, 1+0.2×2 times), and the width of the area of the attracted region R1 may be 1.4 times the width of the basic working area (that is, 1+0.2×2 times), thus the area of the attracted region R1 can be 1.96 times the basic working area. Therefore, accordingly to the design of the present disclosure, a ratio of the area of the attracted region R1 to the basic working area may be, for example, greater than or equal to 1.44 and less than or equal to 1.96 (1.44≤R1/basic working area≤1.96), but it is not limited thereto.

Figure 2C:
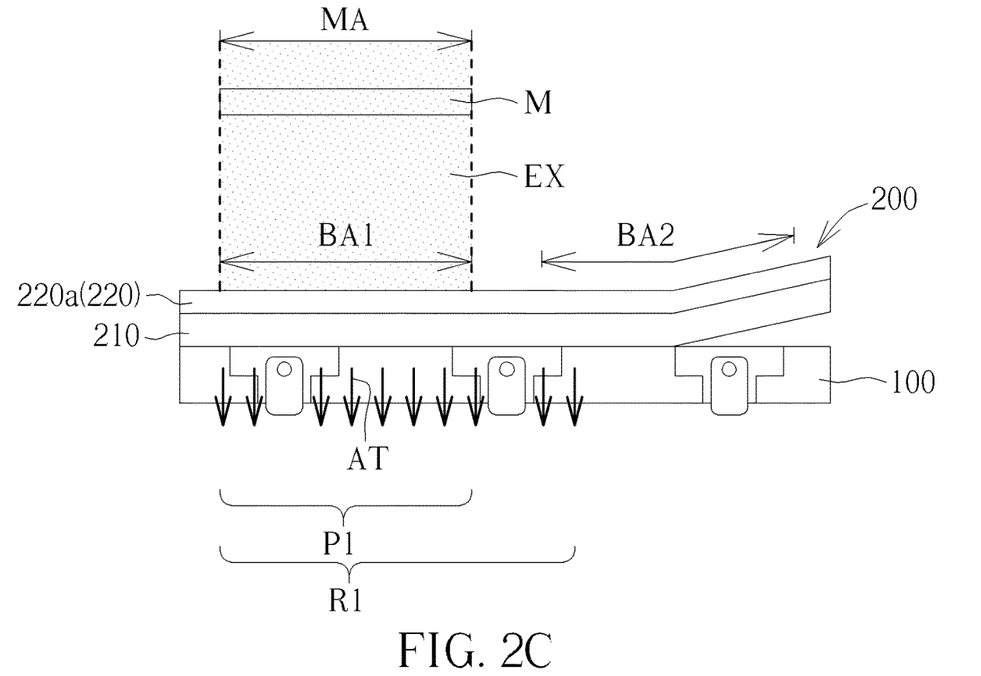

After step S130, perform step S140. As shown in FIG. 2C, a portion P1 of the attracted region R1 corresponding to the subset BA1 is exposed, which means that the region where the exposure step EX is actually performed through light exposure with mask M is the portion P1 of the attracted region R1, wherein the area of the portion P1 under the exposure step EX may be approximately equal to the basic working area and/or the portion P1 may overlap with the subset BA1. It should be noted that "approximately equal" here means that there may be a slight error or tolerance between the area of the portion P1under the exposure step EX and the basic working area. For example, the difference between the two is within the range of 20% of the basic working area, or within the range of 10%, 5%, 3%, 2%, 1% or 0.5% of the basic working area. In some embodiments of the disclosed method, the area of the substrate 200 may be N times the basic working area, wherein N may be, but not limited to, a positive integer. For example, the area of the substrate 200 may be 2 times, 4 times, 9 times, etc., the basic working area, but it is not limited thereto. In other embodiments of the disclosed method, the area of the substrate 200 may be greater than N times the basic working area, wherein N is a positive integer, such as 2, 4, 9, etc., but it is not limited thereto.

Figure 2D:
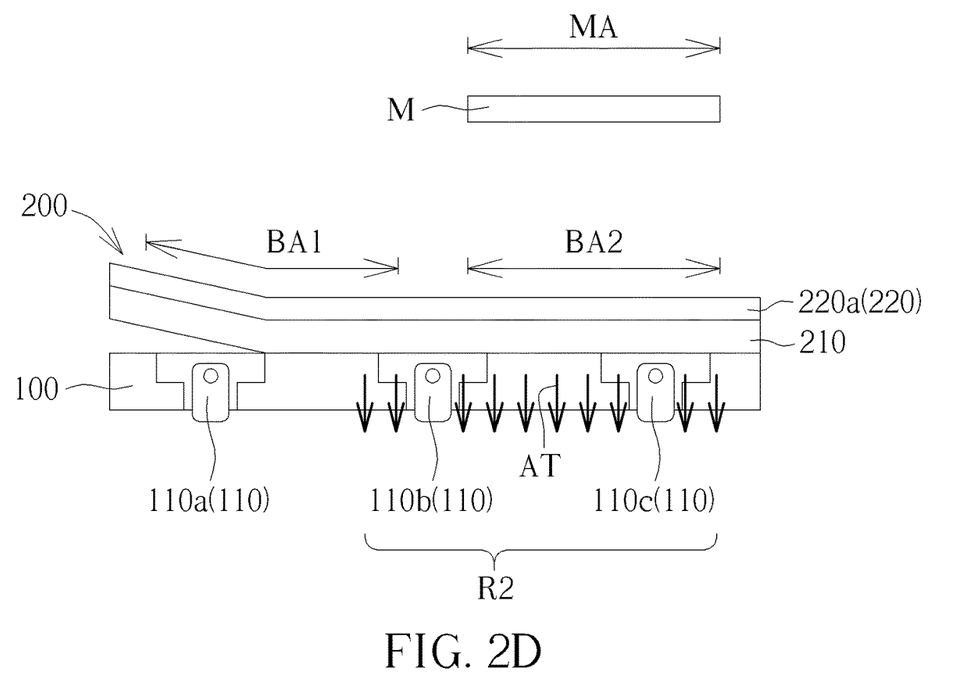
Figure 2E:
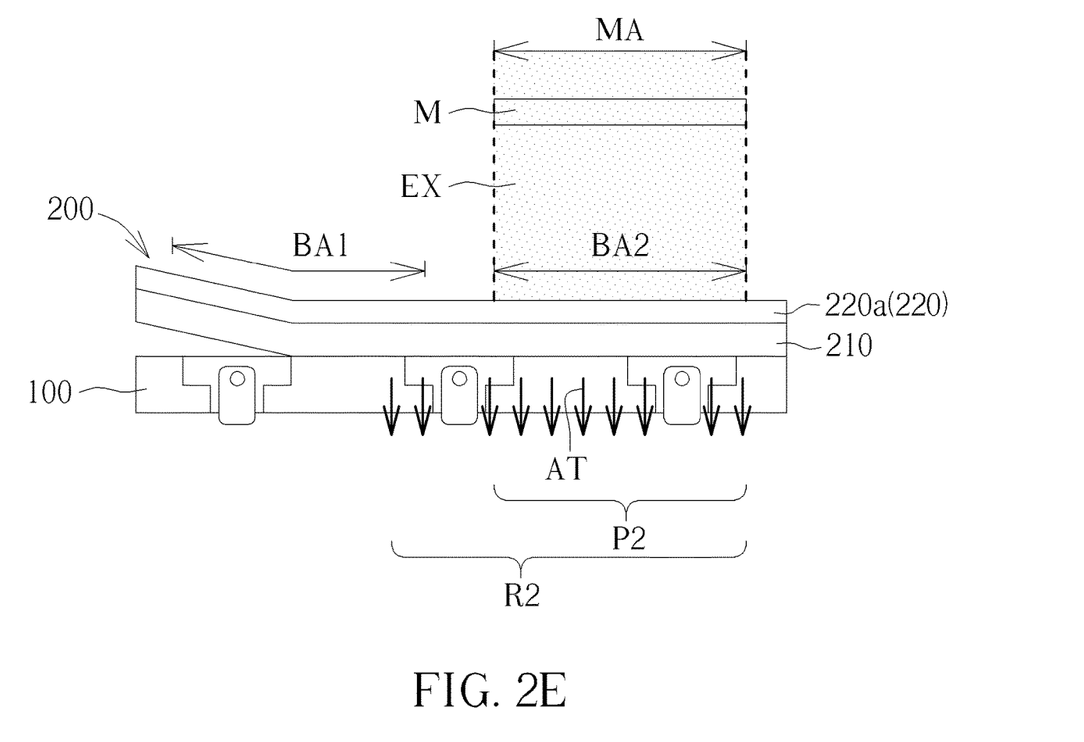

In some embodiments, as shown in FIG. 2D, the same exposure step EX may be performed continually on another subset (such as the subset BA2) after step S140, that is, after performing the exposure step EX on the portion P1 of the attracted region R1 (that is, the subset BA1). The way of implementation is to apply a vacuum attraction step AT to another portion of the substrate 200 through a portion of the plurality of vacuum valves 110 (for example, the vacuum valve 110b and the vacuum valve 110c), wherein another portion of the substrate 200 corresponding to the vacuum attraction is defined as another attracted region R2. The attracted region R2 may be another region of the substrate 200 that is at least partially different from the attracted region R1, and the size of the attracted region R2 may be approximately equal to that of the attracted region R1, wherein the attracted region R2 may be, for example (but not limited to), adjacent to and partially overlapped with the attracted region R1. It should be noted that "approximately equal" here means that there may be a slight error or tolerance between the areas of the two attracted regions R1 and R2. Next, as shown in FIG. 2E, a portion P2 of another attracted region R2 may be exposed, that is, the region where the exposure step EX is actually performed on the attracted region R2 of the substrate 200 through light transmission with mask M is the portion P2 of the attracted region R2, wherein the portion P2 may be exposed while the attracted region R2 is continuously under vacuum attraction, but it is not limited thereto. The area of the portion P2 of the attracted region R2 may be equal to the basic working area, which means that the area of the portion P2 of the substrate 200 under exposure step EX may be approximately equal to the basic working area and/or the portion P2 may overlap with the subset BA2. It should be noted that "approximately equal" here means that there may be a slight error or tolerance between the area of the portion P2 under exposure step EX and the basic working area.

According to above-mentioned method for manufacturing the electronic device of the present disclosure, through setting the basic working area as the basis, vacuum attraction and exposure steps may be performed in subsection on the substrate so as to complete the exposure manufacturing process of the entire substrate. Thereby, the difficulty of producing the electronic devices can be reduced, the manufacturing cost can be lowered, or the effect of improving product quality is further achieved.

Figure 3:
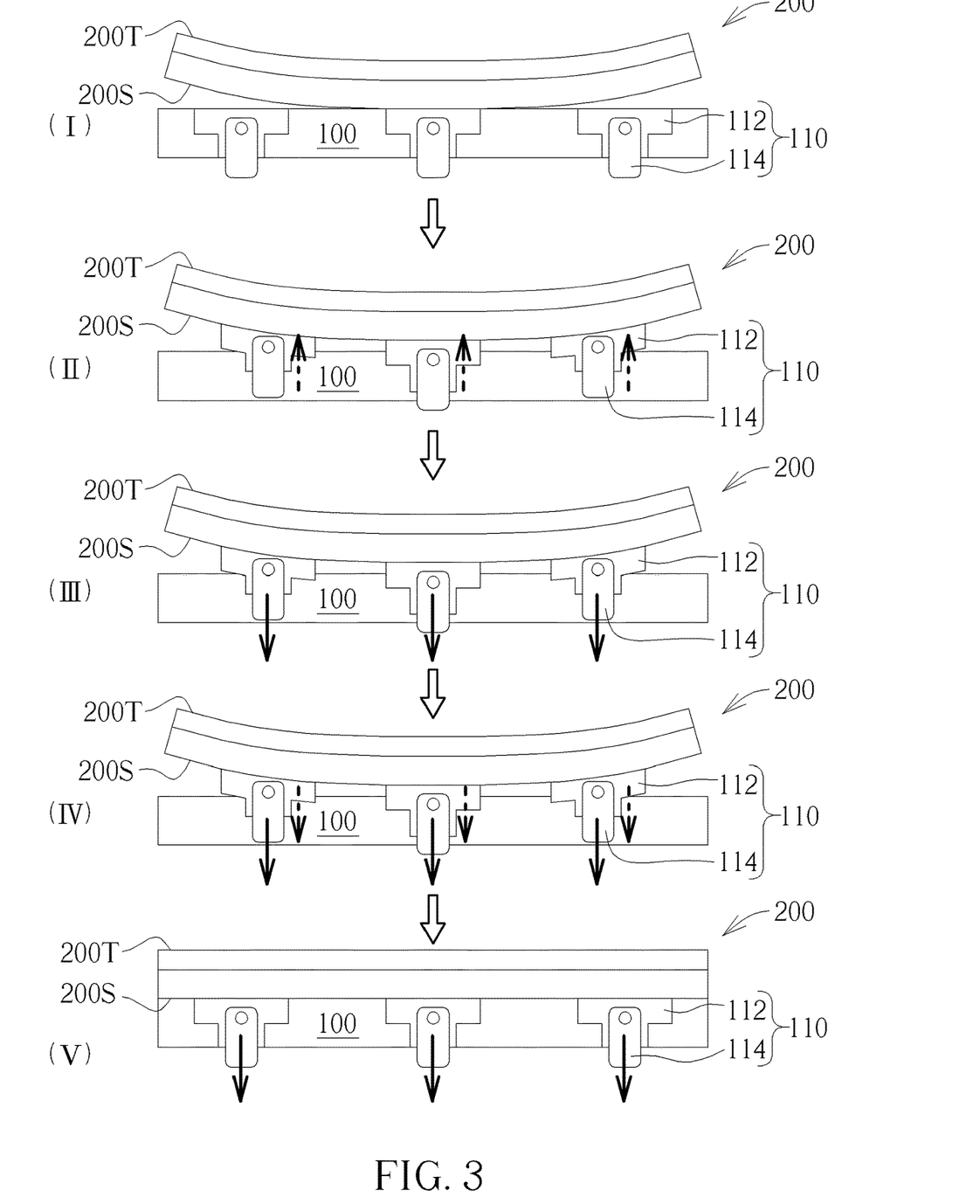
FIG. 3 is a schematic view of a manufacturing process for applying vacuum attraction in the method for manufacturing the electronic device of the present disclosure.
Figure 4:
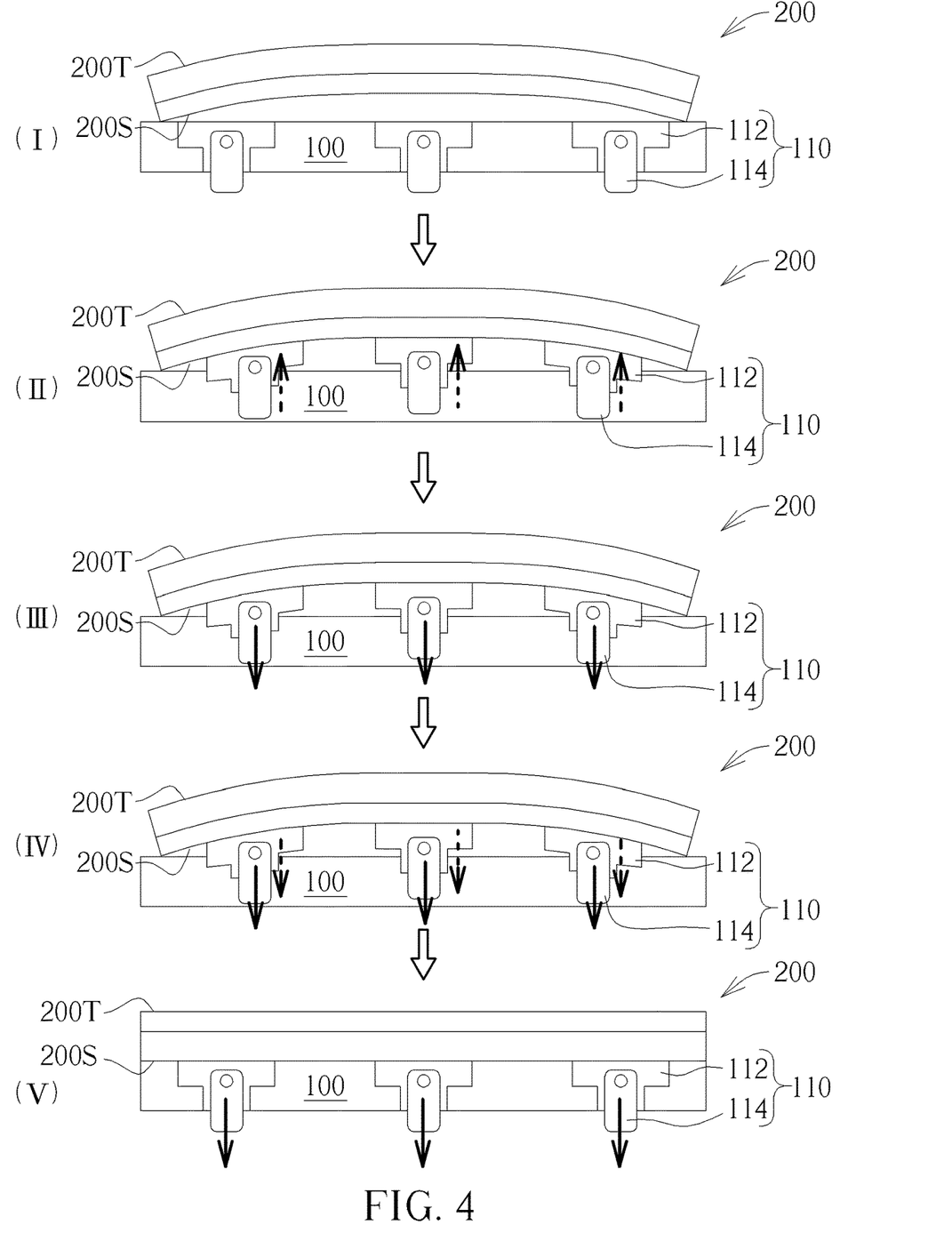
FIG. 4 is a schematic view of another manufacturing process for applying vacuum attraction in the method for manufacturing the electronic device of the present disclosure.

Referring to FIG. 3 and FIG. 4, FIG. 3 is a schematic view of a manufacturing process for applying vacuum attraction in the method for manufacturing the electronic device of the present disclosure. FIG. 4 is a schematic view illustrating another manufacturing process for applying vacuum attraction in the method for manufacturing the electronic device of the present disclosure. Among them, the plurality of vacuum valves 110 disposed on the supporting platform 100 may be liftable, movable or angle adjustable vacuum valves. For example, each vacuum valve 110 includes a freely angle adjustable valve 112 and a liftable vacuum rod 114. In some embodiments, when the warpage of the substrate 200 shows a concave shape (as shown in FIG. 3) or when the substrate 200 shows a convex shape (as shown in FIG. 4), the vacuum rod 114 can be raised and the angle of the valve 112 can be adjusted, and each vacuum valve 110 respectively attracts and attaches to the bottom surface 200S of the substrate 200. Next, apply vacuum attraction and lower the vacuum rod 114 to attract the substrate 200 flat substantially (that is, the bottom surface 200S of the substrate 200 is substantially flat against the surface of the supporting platform 100), so as to facilitate the implementation of the subsequent manufacturing processes, but it is not limited thereto.

In detail, as shown in FIG. 3, in step (I), the warpage of the substrate 200 is a concave shape, and thus the both sides (or outer sides) of the bottom surface 200S are upwardly warped and farther away from the supporting platform 100. When preparing for vacuum attraction, as shown in step (II), the vacuum rods 114 can drive the valves 112 to raise together (indicated by dashed arrows), particularly to raise the valves 112 on the both sides or outer sides, and adjust the angles of the valves 112 to attach to both sides (or outer sides) of the bottom surface 200S. Then, as in step (III), the valves 112 are used to apply vacuum attraction to the substrate 200 to provide the bottom surface 200S with a downward attraction (indicated by the solid arrows). In the process of continuous attraction, as shown in step (IV), the vacuum rods 114 can drive the valves 112 to move downward (indicated by the dashed arrows). Last, as shown in step (V), the vacuum rods 114 and the valves 112 can return to their original positions on the supporting platform 100, and the bottom surface 200S of the substrate 200 is attracted to substantially attach to the upper surface of the supporting platform 100, and the bottom surface 200S and the top surface 200T of the substrate 200 are maintained substantially parallel to the upper surface of the supporting platform 100. In contrast, as shown in FIG. 4, in the step (I), the warpage of the substrate 200 is a convex shape, so the both sides (or outer sides) of the bottom surface 200S are bent down and closer to the supporting platform 100, and the middle region of the bottom surface 200S is farther away from the supporting platform 100. When preparing for vacuum attraction, as shown in step (II), the vacuum rods 114 can drive the valves 112 to raise together (indicated by the dashed arrows), particularly to raise the valves 112 near the middle region of the supporting platform 100 and adjust the angles of the valves 112 to attach to the bottom surface 200S. Then, as in step (III), the valves 112 are used to apply vacuum attraction to the substrate 200 to provide the bottom surface 200S with a downward attraction (indicated by the solid arrows). In the process of continuous attraction, as shown in step (IV), the vacuum rods 114 can drive the valves 112 to move downward (indicated by the dashed arrows). Last, as shown in step (V), the vacuum rods 114 and the valves 112 can return to their original positions on the supporting platform 100, and the bottom surface 200S of the substrate 200 is attracted to substantially attach to the upper surface of the supporting platform 100 such that the bottom surface 200S and the top surface 200T of the substrate 200 are maintained substantially parallel to the upper surface of the supporting platform 100.

Figure 5A:
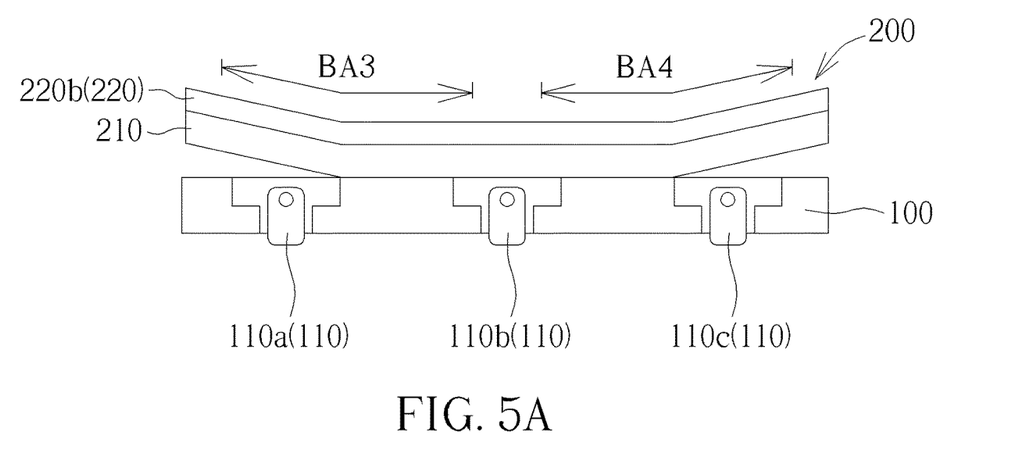
FIG. 5A to 5E are schematic views of another manufacturing process of the method for manufacturing the electronic device of the present disclosure.

Referring to FIG. 5A to FIG. 5E, FIG. 5A to FIG. 5E are schematic diagrams of another manufacturing process of the method for manufacturing the electronic device of the present disclosure. The method for manufacturing the electronic device of the present disclosure may further include performing a polishing process on the substrate 200. The detailed manufacturing process is as follows. As shown in FIG. 5A, a supporting platform 100 having a plurality of vacuum valves 110 is provided. In the case that the exposure process of FIG. 2A to FIG. 2E and the polishing process shown in FIG. 5A to FIG. 5E are successive processes, or the two are sequential processes on the same substrate 200, the supporting platform 100 used in the polishing process of FIG. 5A to 5E and the supporting platform used in the exposure process may be, for example, the same supporting platform, or the polishing process may also be performed on another supporting platform, it is not limited. In FIG. 5A, the substrate 200 is disposed on the supporting platform 100, wherein the detailed features, such as the structure and the material of the substrate 200, are described in detail in the foregoing embodiment, and will not be repeated here. Since the present embodiment merely shows the case of the polishing process as an example, for simplicity, FIG. 5A only depicts the base 210 and the metal layer 220b in the substrate 200, while the layer on the base 210 may be not only the metal layer 220b. In the manufacturing process, the substrate 200 may be prone to warpage due to the material issues. FIG. 5A also depicts that the substrate 200 disposed on the supporting platform 100 is warped, for example, on the left and right sides of the substrate 200.

Figure 5B:
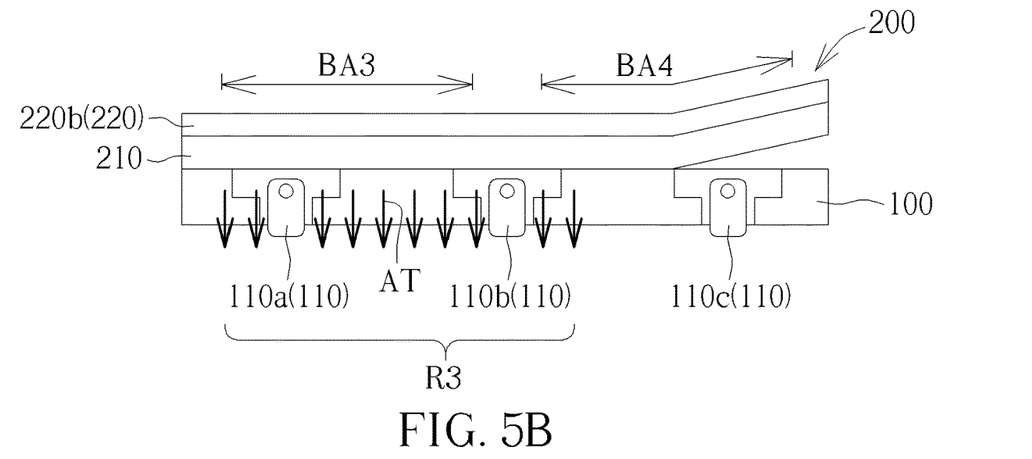
Figure 5C:
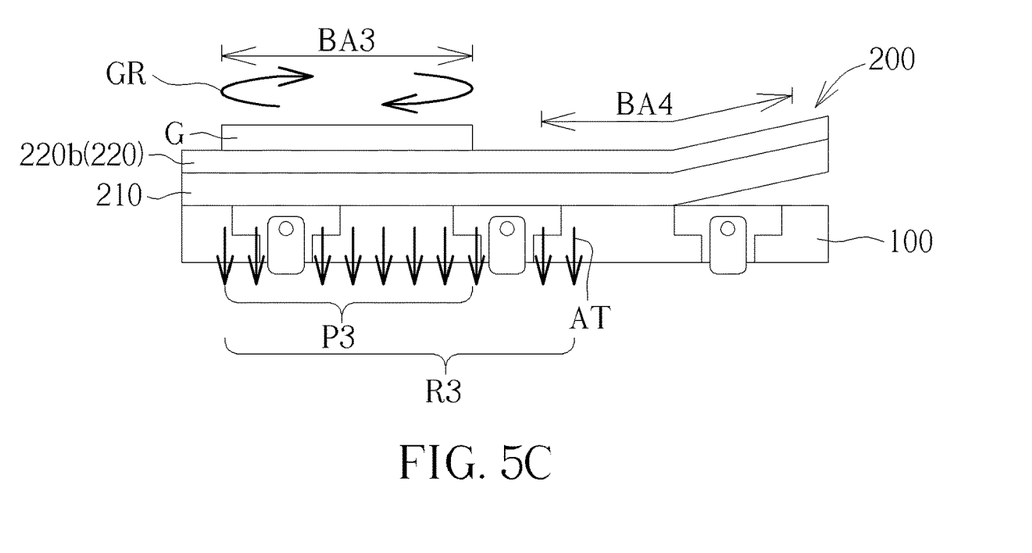

Next, as shown in FIG. 5B, a vacuum attraction step AT is performed on a portion of the substrate 200 through a portion of the plurality of vacuum valves 110 (for example, the vacuum valve 110b and the vacuum valve 110a), wherein the portion of the substrate 200 corresponding to the vacuum attraction is defined as an attracted region R3. In some embodiments, the attracted region R3 and the attracted region R1 may be, for example, the same region, which means that the size of the attracted region R3 may be equal to the size of the attracted region R1, or the attracted region R3 may overlap with the attracted regions R1 of the previous embodiment. Alternatively, the attracted region R3 and the attracted region R1 may be different regions, for example, the attracted region R3 may be a region adjacent to the attracted region R1. Next, as shown in FIG. 5C, polishing a portion P3 of the attracted region R3. For example, a polishing step GR is performed on the portion P3 of the attracted region R3 of the substrate 200 through a polishing head G, that is, the portion P3 where the polishing step GR is actually performed locates within the attracted region R3, and the portion P3 is smaller than the attracted region R3, wherein the portion P3 of the attracted region R3 and the portion P1 of the attracted region R1 can be, for example, the same portion, or the portion P3 of the attracted region R3 and the portion P1 of the attracted region R1 can be different portions. The portion P3 may be polished while the attracted region R3 is continuously under vacuum attraction, but it is not limited thereto. In some embodiments, the area of the portion P3 of the attracted region R3 may be approximately equal to the basic working area, that is, the portion P3 of the substrate 200 where the polishing step GR is performed corresponds to a subset BA3, and its area is approximately equal to the basic working area. It should be noted that "approximately equal" here means that there may be a slight error or tolerance between the area of the portion P3 under the polishing step GR and the basic working area.

Figure 5D:
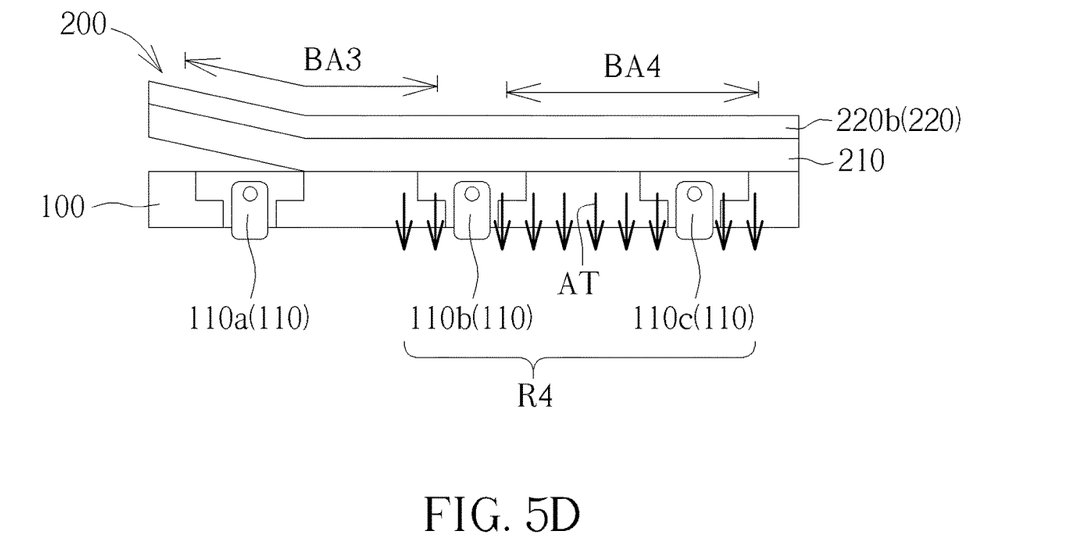
Figure 5E:
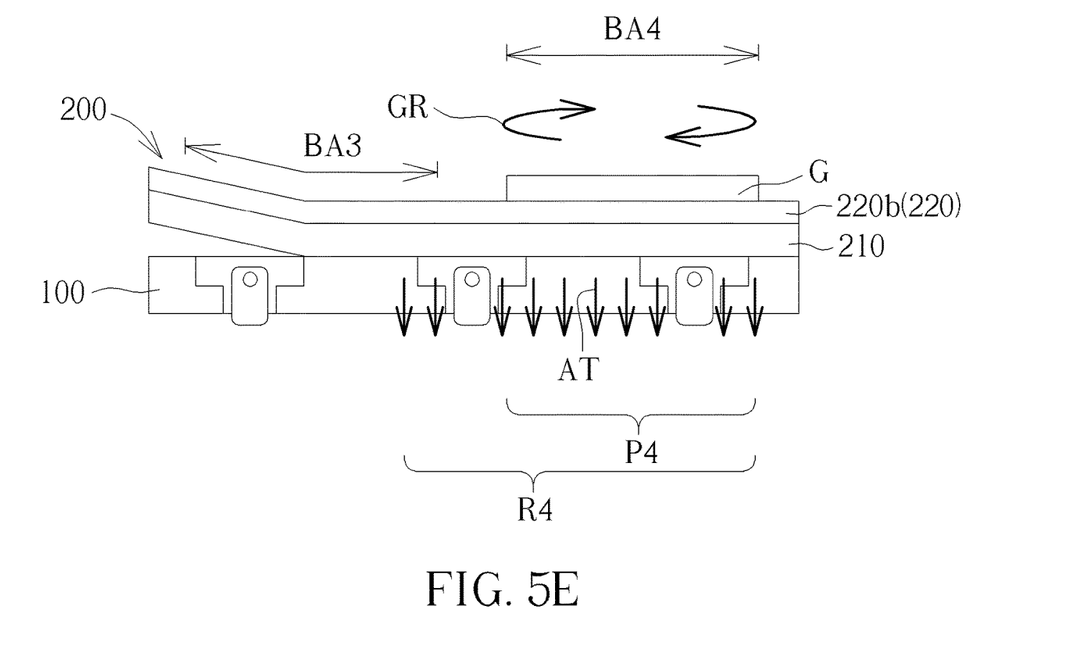

In some embodiments, as shown in FIG. 5D, after the polishing step GR is performed on the portion P3 of the attracted region R3, a vacuum attraction step AT is performed on another portion of the substrate 200 through a portion of the plurality of vacuum valves 110 (for example, the vacuum valve 110b and the vacuum valve 110c), wherein another portion of the substrate 200 corresponding to the vacuum attraction is defined as another attracted region R4. The attracted region R4 may be another region of the substrate 200 that is at least partially different from the attracted region R3, and the size of the attracted region R4 may be equal to the size of the attracted region R3, wherein the attracted region R4 may be, for example, (but not limited to) adjacent to and partially overlapped with the attracted region R3. Next, as shown in FIG. 5E, polishing a portion P4 of another attracted region R4, that is, the region where the polishing step GR is actually performed on the substrate 200 through the polishing head G is the portion P4 of the attracted region R4, wherein the portion P4 may be smaller than the attracted region R4. The portion P4 may be polished while the attracted region R4 is continuously under vacuum attraction, but it is not limited thereto. The area of the portion P4 of the attracted region R4 may be approximately equal to the basic working area, that is, the portion P4 of the substrate 200 where the polishing step GR is performed corresponds to a subset BA4, and its area is approximately equal to the basic working area. It should be noted that "approximately equal" here means that there may be a slight error or tolerance between the area of the portion P4 under the polishing step GR and the basic working area.

According to above-mentioned method for manufacturing the electronic device of the present disclosure, through setting the basic working area as the basis, vacuum attraction and polishing steps may be performed in subsection on the substrate. Thereby, the difficulty of producing the electronic devices can be reduced, the manufacturing cost can be lowered, or the effect of improving product quality is further achieved.

Figure 6A:
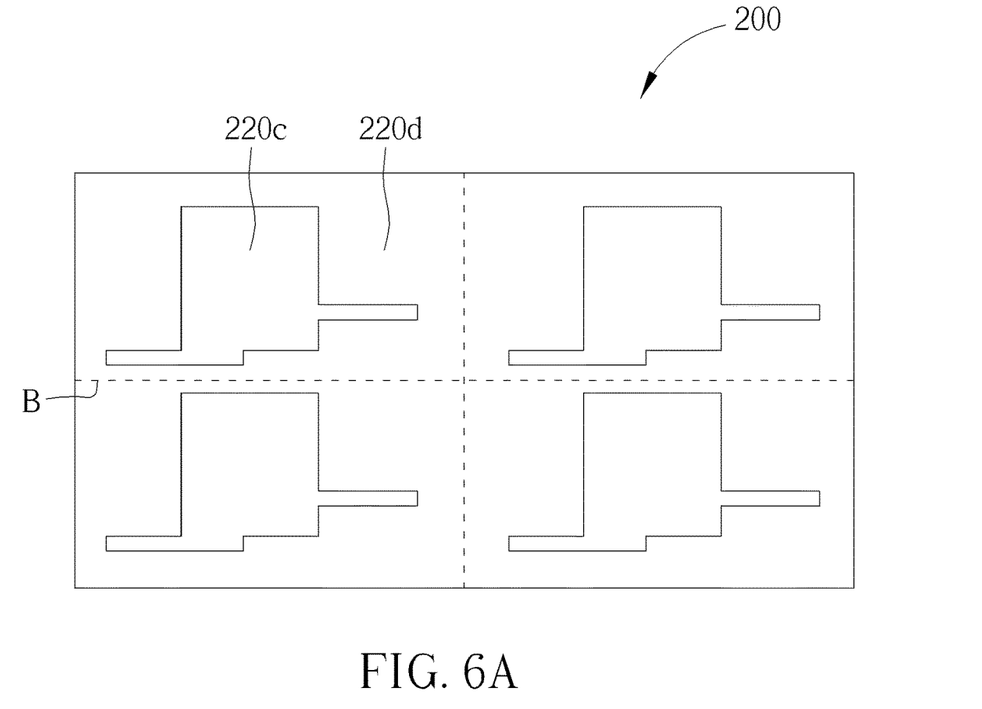
FIG. 6A is a schematic top view of another manufacturing process of the method for manufacturing the electronic device of the present disclosure.
Figure 6B:
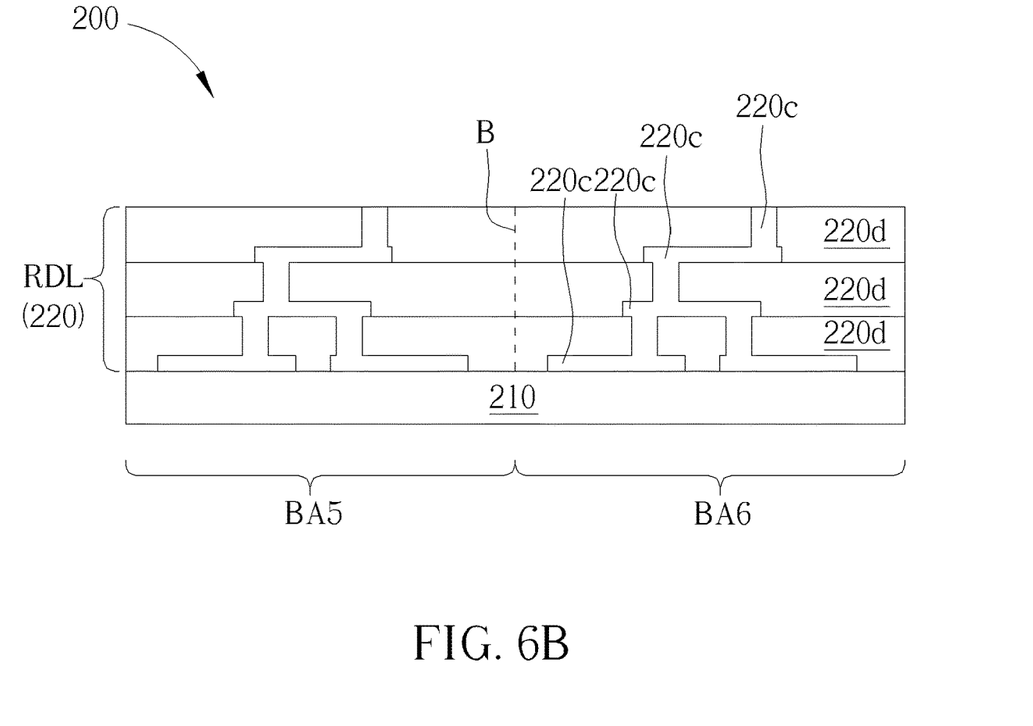
FIG. 6B is a schematic cross-sectional view corresponding to FIG. 6A.

Referring to FIG. 6A and FIG. 6B, FIG. 6A is a schematic top view of another manufacturing process of the method for manufacturing the electronic device of the present disclosure. FIG. 6B is a schematic cross-sectional view corresponding to FIG. 6A. The method for manufacturing the electronic device of the present disclosure may further include conducting an inspection process on the substrate 200, wherein the inspection process may be conducted, for example, (but not limited to) before or after any manufacturing process, between any two manufacturing processes, or before the shipment of the product of the electronic device. As shown in FIG. 6A and FIG. 6B, the substrate 200 may include a base 210 and at least one layer 220, for example, it may include a base 210, one or more metal layers 220c, and one or more dielectric layers 220d. The metal layer(s) 220c and the dielectric(s) layer 220d may form a redistribution layer RDL to redistribute the wires. FIG. 6B is an example of the redistribution layer RDL formed by stacking four metal layers 220c and three dielectric layers 220d, but it is not limited thereto. The inspection process may include defining a boundary B between the adjacent subsets based on the basic working area (such as the boundary B between the subsets BA5 and BA6 as shown in FIG. 6B is a portion of the entire boundary B of the subset BA5), and conducting inspection on the components within the region enclosed by the boundary, for example, through manual visual inspection or by other suitable methods. It should be noted that since boundary B is defined based on the basic working area, the area of the region enclosed by boundary B is approximately equal to the basic working area. It should be noted that "approximately equal" here means that there may be a slight error or tolerance between the area of the region enclosed by the boundary B and the basic working area. In other words, the inspection process of the present disclosure is based on the basic working area of the subset to conduct inspection process in subsection on the entire substrate. The area of one single inspection is smaller, and it is also easier for the components within the range to meet the standard of the technical specification.

Figure 7:
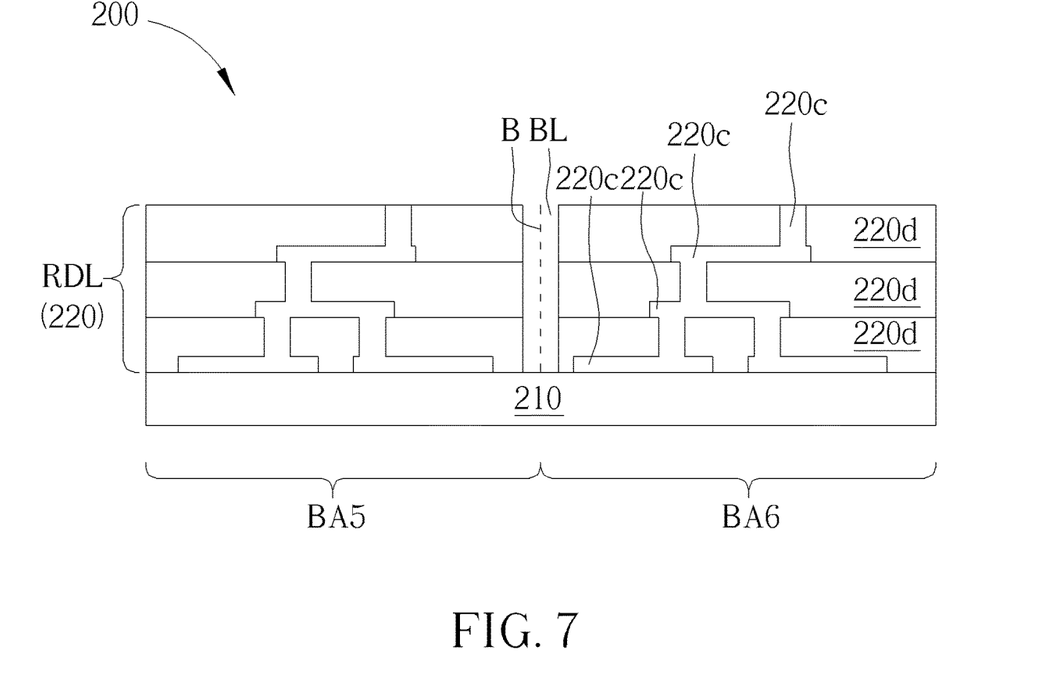
FIG. 7 is a schematic view of the manufacturing process of an embodiment of forming a boundary line according to the method for manufacturing the electronic device of the present disclosure.
Figure 8:
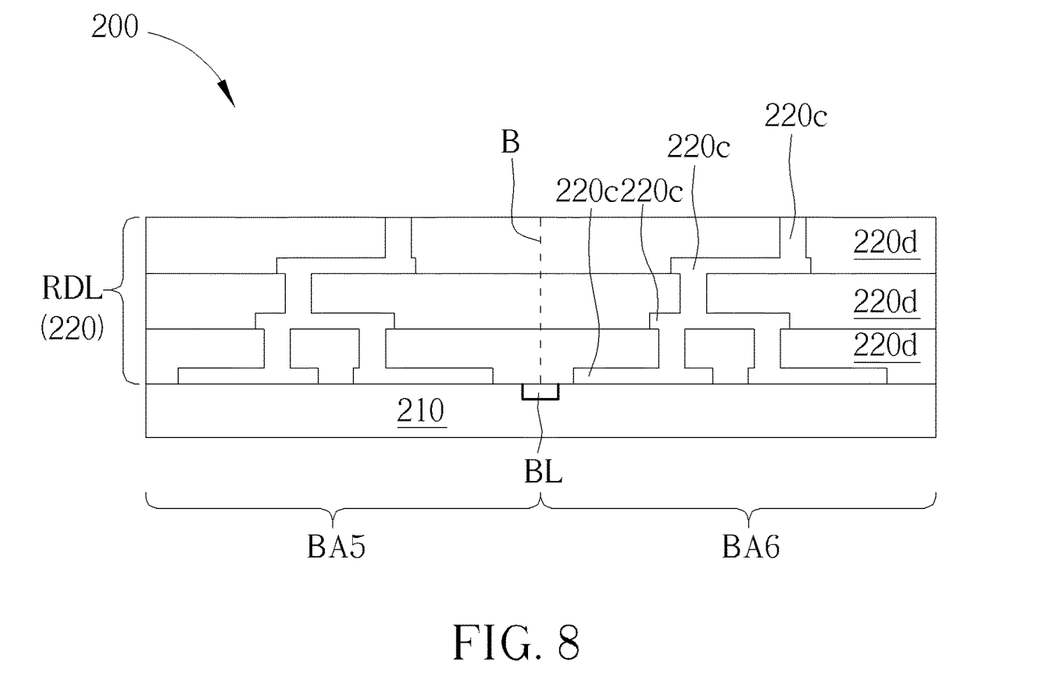
FIG. 8 is a schematic view of the manufacturing process of another embodiment of forming a boundary line according to the method for manufacturing the electronic device of the present disclosure.

Referring to FIG. 7 and FIG. 8, FIG. 7 is a schematic view of the manufacturing process of an embodiment of forming a boundary line according to the method for manufacturing the electronic device of the present disclosure. FIG. 8 is a schematic view of the manufacturing process of another embodiment of forming a boundary line according to the method for manufacturing the electronic device of the present disclosure. In some embodiments, in order to easily confirm the range of inspection, a boundary line BL may be further formed on the substrate 200 to facilitate the identification of the boundary B of each region for manual inspection. The boundary line BL can be formed by removing a portion of the substrate 200 located at the boundary B. For example, in some embodiments, as shown in FIG. 7, the boundary line BL may be formed by removing at least a portion of a layer 220 located at the boundary B of the substrate 200. For example, the boundary line BL can be formed by removing a portion of a plurality of dielectric layers 220d of the substrate 200 located at the boundary B. The method for removing the dielectric layer 220d may include process such as photolithography and development, laser stripping, or mechanical scribing, but it is not limited thereto. In some embodiments, as shown in FIG. 8, a portion of the base 210 of the substrate 200 located at the boundary B may be removed before the layer 220 is formed, so as to form the boundary line BL of each region where the process steps are to be performed in subsection. The method of removing a portion of the base 210 may include, process such as photolithography and development, laser stripping, or mechanical scribing, but it is not limited thereto. By forming the boundary line BL, the distribution of the subsets (such as the subset BA5 and the subset BA6) on the substrate 200 and the boundary B between each other can be better identified. Therefore, during the inspection process such as manual inspection, one subset may be the target of one inspection step, and all subsets may be inspected region by region, or one or some of the regions may be selected for inspection.

Figure 9:
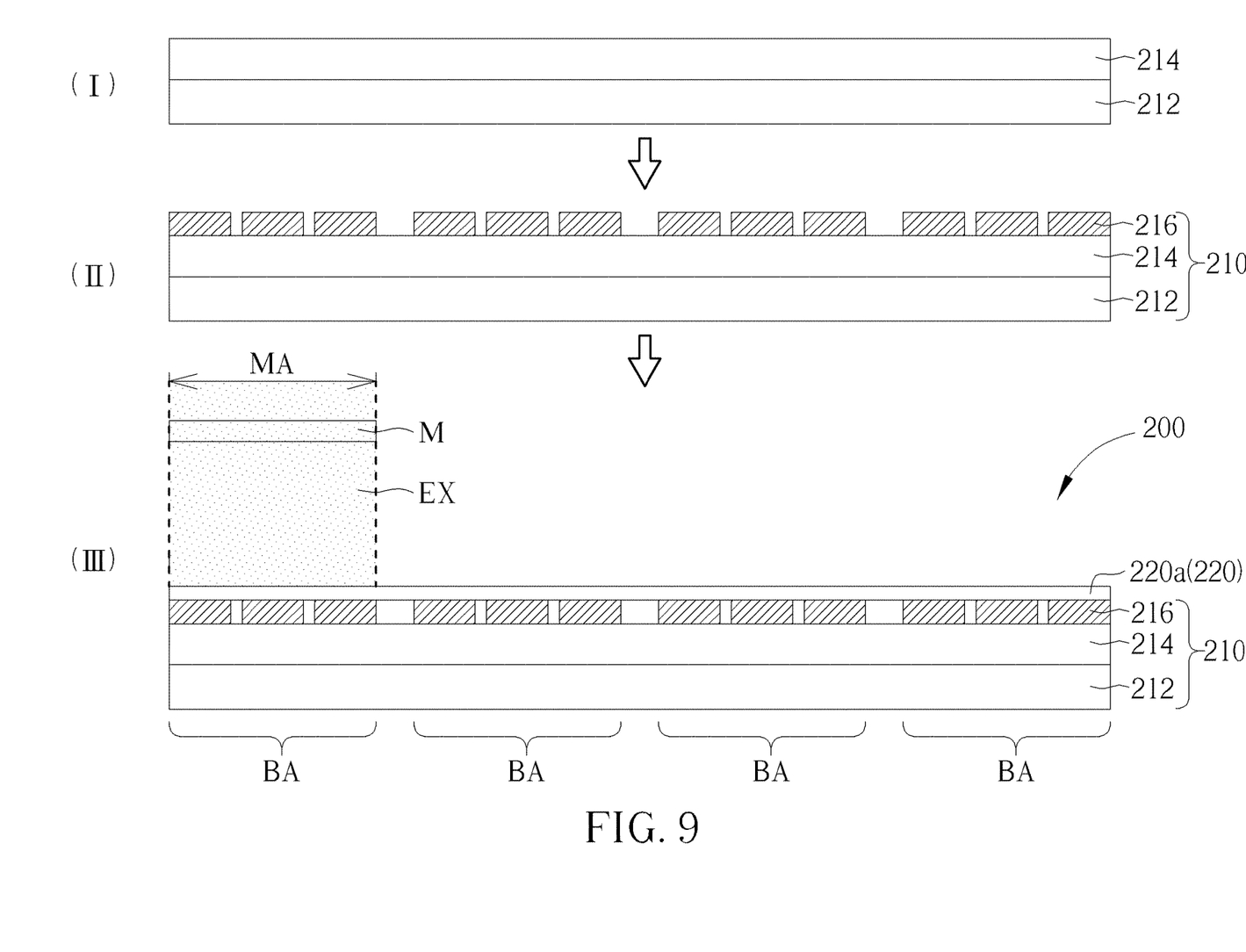
FIG. 9 is a schematic view of a portion of the manufacturing process of an embodiment of the method for manufacturing the electronic device of the present disclosure.

Please refer to FIG. 9. FIG. 9 is a schematic view of a portion of the manufacturing process of an embodiment of the method for manufacturing the electronic device of the present disclosure. In some embodiments, the manufacturing process of the substrate 200 of the electronic device may be a chip-first method. In detail, as shown in FIG. 9, in step (I), a base layer 212 is provided. The base layer 212 may include, for example (but not limited to), glass, and a release layer 214 is formed on the base layer 212. Next, as shown in step (II), a plurality of chips 216 are formed on the release layer 214. For example, the plurality of chips 216 may be attached to the release layer 214, but it is not limited thereto. The base layer 212, the release layer 214 and the chips 216 may form a base 210. In some embodiments, the base layer 212 and the release layer 214 may be selectively omitted, and the plurality of chips 216 may be directly packaged (not shown) to form a base 210, but it is not limited thereto. Then, as shown in step (III), a layer 220 (e.g., a photoresist layer 220a) is formed on the plurality of chips 216. For example, the photoresist layer 220a may be formed on the plurality of chips 216 by electroplating. The photoresist layer 220a may include metal material(s) or other suitable photoresist material(s), and the function of the photoresist layer 220a may be, for example, used for exposing the metal traces on the chips 216 in the exposure process, so as to be electrically connected to the redistribution layer formed subsequently, but it is not limited thereto. According to the steps described above, the substrate 200 may be formed by the chip-first method, but the manufacturing process of forming the substrate 200 in the present disclosure is not limited thereto.

After the substrate 200 is formed, the manufacturing process may be performed in subsections on the substrate 200 according to embodiments described above. For example, vacuum attraction and exposure steps may be performed in subsection as shown in FIG. 2A to FIG. 2E, or vacuum attraction and polishing steps may be performed in subsection as shown in FIG. 5A to FIG. 5E. In the step (III) of FIG. 9, a mask M used in the exposure process and the exposure step EX are illustrated, and an area MA of the mask M is taken as an exposure area of one shot of the exposure step EX, and is defined as the basic working area of the subset. Therefore, a plurality of subsets BA may be defined on the substrate 200, and at least one of the plurality of chips 216 is disposed in each of the subsets BA, but the definition of the basic working area described above is not limited thereto.

According to the above-mentioned method for manufacturing the electronic device of the present disclosure, the basic working area may be set to perform manufacturing process in subsection on the substrate. This method can be applied to the manufacturing process of general electronic products (such as the panel-level package products). For example, it can be applied to the related processes of each layer in the redistribution layer process, including seed layer related processes (such as seed layer deposition and removal process), photoresist layer related processes (such as photoresist coating, photoresist exposure, photoresist development, and photoresist removal), metal layer related processes (such as metal plating and metal polishing), dielectric layer related processes (such as dielectric layer coating, dielectric layer soft baking, dielectric layer exposure, dielectric layer development, and dielectric layer hard baking), dry film related processes (such as dry film alignment, dry film exposure, and dry film development). It can be particularly applied to, for example, photoresist exposure, metal polishing, dielectric layer exposure or dry film exposure process, but it is not limited thereto.

In some embodiments, the method disclosed in the present disclosure by setting the basic working area to perform manufacturing process in subsection on the substrate can also be applied to the manufacturing process of liquid crystal display (LCD) products. For example, it can be applied to the related processes of each layer in the laminated structure, including metal layer related processes (such as metal deposition and metal etching), photoresist layer related processes (such as photoresist coating, photoresist exposure, photoresist development, photoresist stripping, photoresist soft baking, and photoresist hard baking), insulating layer related processes (such as insulating layer deposition, insulating layer etching, wherein the insulating layer may be, for example, an interlayer dielectric layer, a gate dielectric layer, a protective layer, a buffer layer, etc.), semiconductor layer related processes (such as semiconductor layer deposition, and semiconductor layer etching), indium-tin oxide (ITO) layer or transparent conductive layer related processes (such as indium tin oxide layer deposition and indium tin oxide layer etching), black matrix layer (BM) related processes, and color photoresist layer related processes. It can be particularly applied to the photoresist exposure process, but it is not limited thereto.

In summary, according to the method for manufacturing the electronic device of the present disclosure, through setting the basic working area as the basis to perform the manufacturing process in subsection on the substrate, the difficulty of producing the electronic devices can be reduced and the manufacturing cost can be lowered, or the effect of improving product quality is further achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A method for manufacturing an electronic device, comprising:
   setting a basic working area;
   providing a supporting platform having a plurality of vacuum valves;
   disposing a substrate on the supporting platform, wherein the substrate comprises a chip;
   applying vacuum attraction to a portion of the substrate through a portion of the plurality of vacuum valves, wherein the portion of the substrate corresponding to the vacuum attraction is defined as an attracted region; and
   performing an exposure on a portion of the attracted region,
   wherein an area of the attracted region is larger than the basic working area and smaller than an area of the supporting platform.

2. The method for manufacturing the electronic device according to claim 1, wherein the substrate comprises a base.

3. The method for manufacturing the electronic device according to claim 2, wherein the base comprises glass, sapphire, ceramics, or polymeric materials.

4. The method for manufacturing the electronic device according to claim 1, wherein the substrate comprises a redistribution layer.

5. The method for manufacturing the electronic device according to claim 4, wherein the redistribution layer is formed by stacking at least one metal layer and at least one dielectric layer.

6. The method for manufacturing the electronic device according to claim 1, wherein an area of the portion of the attracted region under the exposure is equal to the basic working area.

7. The method for manufacturing the electronic device according to claim 1, wherein a ratio of the area of the attracted region to the basic working area is greater than or equal to 1.44 and less than or equal to 1.96.

8. The method for manufacturing the electronic device according to claim 1, further comprising a polishing step, wherein an area of a portion of the substrate to be polished is equal to the basic working area.

9. The method for manufacturing the electronic device according to claim 8, wherein a supporting platform used in the polishing step and the supporting platform used in the exposure process are the same.

10. The method for manufacturing the electronic device according to claim 8, wherein a supporting platform used in the polishing step and the supporting platform used in the exposure process are different.

11. The method for manufacturing the electronic device according to claim 8, wherein the portion which the exposure performs on and the portion to be polished are the same.

12. The method for manufacturing the electronic device according to claim 8, wherein the portion which the exposure performs on and the portion to be polished are different.

13. The method for manufacturing the electronic device according to claim 1, further comprising:
   defining a boundary based on the basic working area; and
   conducting an inspection on at least one component within an region enclosed by the boundary, wherein an area of the region enclosed by the boundary is equal to the basic working area.

14. The method for manufacturing the electronic device according to claim 13, wherein a boundary line is formed by removing a portion of the substrate located at the boundary.

15. The method for manufacturing the electronic device according to claim 1, wherein the electronic device comprises a panel, a liquid crystal antenna or a package component.

16. The method for manufacturing the electronic device according to claim 1, wherein the plurality of vacuum valves are liftable, movable, or angle adjustable.

17. The method for manufacturing the electronic device according to claim 1, further comprising:
   after performing the exposure on the portion of the attracted region, applying vacuum attraction to another portion of the substrate through another portion of the plurality of vacuum valves, wherein the another portion of the substrate corresponding to the vacuum attraction is defined as another attracted region; and
   performing an exposure on a portion of the another attracted region.

18. The method for manufacturing the electronic device according to claim 17, wherein the another attracted region is partially overlapped with the attracted region.

19. The method for manufacturing the electronic device according to claim 1, wherein an area of the substrate is N times the basic working area, wherein N is a positive integer.

* * * * *